(12) United States Patent
Daigle et al.

(10) Patent No.: US 8,818,005 B2
(45) Date of Patent: Aug. 26, 2014

(54) CAPACITOR CONTROLLED SWITCH SYSTEM

(75) Inventors: Tyler Daigle, Portland, ME (US); Julie Stultz, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 619 days.

(21) Appl. No.: 13/109,440

(22) Filed: May 17, 2011

(65) Prior Publication Data

US 2012/0293227 A1    Nov. 22, 2012

(51) Int. Cl.
*H02B 1/00* (2006.01)

(52) U.S. Cl.
USPC ............. 381/123; 381/94.5; 381/94.1; 381/7; 381/58; 381/56; 381/120; 700/94; 307/130; 307/112; 307/113; 307/125; 307/126; 307/131; 327/108; 327/170; 327/83; 327/112; 327/17; 327/31; 327/33; 327/384; 327/306

(58) Field of Classification Search
USPC ......... 381/7, 58, 56, 96, 120, 123, 94.1, 94.5; 327/108, 170, 83, 112, 17, 31, 33, 384; 700/94; 307/130, 112–113, 125–126, 307/131

See application file for complete search history.

(56) References Cited

U.S. PATENT DOCUMENTS

| 3,908,136 | A |   | 9/1975 | Desperques-Volmier |
|---|---|---|---|---|
| 4,611,135 | A | * | 9/1986 | Nakayama et al. ............ 327/391 |
| 4,638,507 | A | * | 1/1987 | Palara et al. ................. 381/94.5 |
| 4,835,649 | A |   | 5/1989 | Salerno |
| 5,027,019 | A | * | 6/1991 | Shiohara ....................... 327/386 |
| 5,436,588 | A |   | 7/1995 | Ghaffaripour |
| 5,539,610 | A |   | 7/1996 | Williams et al. |
| 5,796,303 | A | * | 8/1998 | Vinn et al. ...................... 330/51 |
| 6,008,687 | A |   | 12/1999 | Orita et al. |
| 6,040,740 | A |   | 3/2000 | Dondale |
| 6,275,094 | B1 |   | 8/2001 | Cranford, Jr. et al. |
| 6,469,564 | B1 |   | 10/2002 | Jansen |
| 6,504,424 | B1 |   | 1/2003 | Heminger et al. |
| 6,665,354 | B1 |   | 12/2003 | Drapkin et al. |
| 6,828,846 | B2 |   | 12/2004 | Tsukazaki et al. |
| 6,958,592 | B2 | * | 10/2005 | Chapuis ........................ 323/246 |

(Continued)

FOREIGN PATENT DOCUMENTS

| CN | 202872751 | 4/2013 |
|---|---|---|
| JP | H0779145 | 3/1995 |
| JP | 2006203362 | 8/2006 |

OTHER PUBLICATIONS

Texas Instrument, CMOS Bilateral Switch, Apr. 2011.*

(Continued)

*Primary Examiner* — Davetta W Goins
*Assistant Examiner* — Kuassi Ganmavo
(74) *Attorney, Agent, or Firm* — Grossman Tucker Perreault & Pfleger PLLC

(57) ABSTRACT

A switch controller is provided that uses one or more capacitors to generate a slow turn on/slow turn off switch control signals to suppress audible switching noise in an audio switch. In some embodiments, an analog inverter and a capacitor are used to generate the switch control signals, while in other embodiments two capacitors are used to generate the switch control signals. To conserve power between switching states, routing logic is provided that ties the switch control signals to respective voltage rails and disables selected portions of the switch controller.

20 Claims, 4 Drawing Sheets

(56) References Cited

U.S. PATENT DOCUMENTS

| | | |
|---|---|---|
| 6,987,418 B2 | 1/2006 | Kim et al. |
| 7,227,413 B1 | 6/2007 | Marty |
| 7,345,522 B2 | 3/2008 | Owen |
| 7,382,187 B2 | 6/2008 | Aisu |
| 7,671,679 B2 | 3/2010 | Aisu |
| 7,711,128 B2 | 5/2010 | Hagino |
| 7,777,574 B1 | 8/2010 | Nielsen |
| 8,450,987 B2 * | 5/2013 | Huang .......... 323/282 |
| 8,502,595 B2 | 8/2013 | Stultz et al. |
| 8,624,441 B2 * | 1/2014 | Liu et al. .......... 307/130 |
| 2006/0023897 A1 | 2/2006 | Ginsberg et al. |
| 2011/0057715 A1 | 3/2011 | Guo |

OTHER PUBLICATIONS

Maxim, quad spdt, clickless audio switches with negative signal handling, 2006.*

Analog devices, analog switches and multiplexers basics, 2009.*

Analog devices, quad audio switch SSM2404.*

U.S. Notice of Allowance dated Apr. 2, 2013 issued in U.S. Appl. No. 13/428,218, 10 pages.

U.S. Office Action date Mar. 26, 2013 issued in U.S. Appl. No. 13/428,382, 12 pages.

* cited by examiner

CAPACITOR CONTROLLED SWITCH SYSTEM

FIELD

The present disclosure relates to a switch system, and more particularly, to a capacitor controlled switch system that provides controlled turn on and turn off times for a switch.

BACKGROUND

Audio systems/circuits often use transistor switches to switch an audio input (source) to an audio output. In the conventional switch system, a generally rectangular switch control signal is used to control the conduction state of the transistor switches. Typically, the hard edge of the control signal causes an abrupt change of state of the switch, which in turn may cause an audible noise (e.g., pop or click) at the output. In addition, switching between audio sources and outputs is a relatively infrequent event, but the conventional switch system typically continues to draw significant current during a steady state period (e.g., periods when no switching is occurring), and thus the conventional switching system may suffer from a lack of power management control, increased unnecessary current draw and/or thermal management problems.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure provides a switch control system for CMOS switches. In one example, a switch controller includes a capacitor that is controlled to charge or discharge to generate a slow ramp up or ramp down switch control signal which is supplied to one side of at least one CMOS switch. An analog inverter is used to generate a complimentary ramp down or ramp up switch control signal which is supplied to the other side of the at least one CMOS switch. In another embodiment, the analog inverter may be replaced with a second capacitor, and the capacitors are controlled to charge and discharge to provide respective complimentary switch control signals. In either embodiment, once the ramping-up switch control signal is above a selected high threshold (and the ramping down switch control signal is below a selected low threshold), each switch control signal may be tied to an appropriate rail voltage to maintain the switch in the selected state. Various components of the switch controller may be disabled once the switch control signals are tied to an appropriate rail voltage, to reduce or eliminate power consumption of the switch controller.

Figure 1:
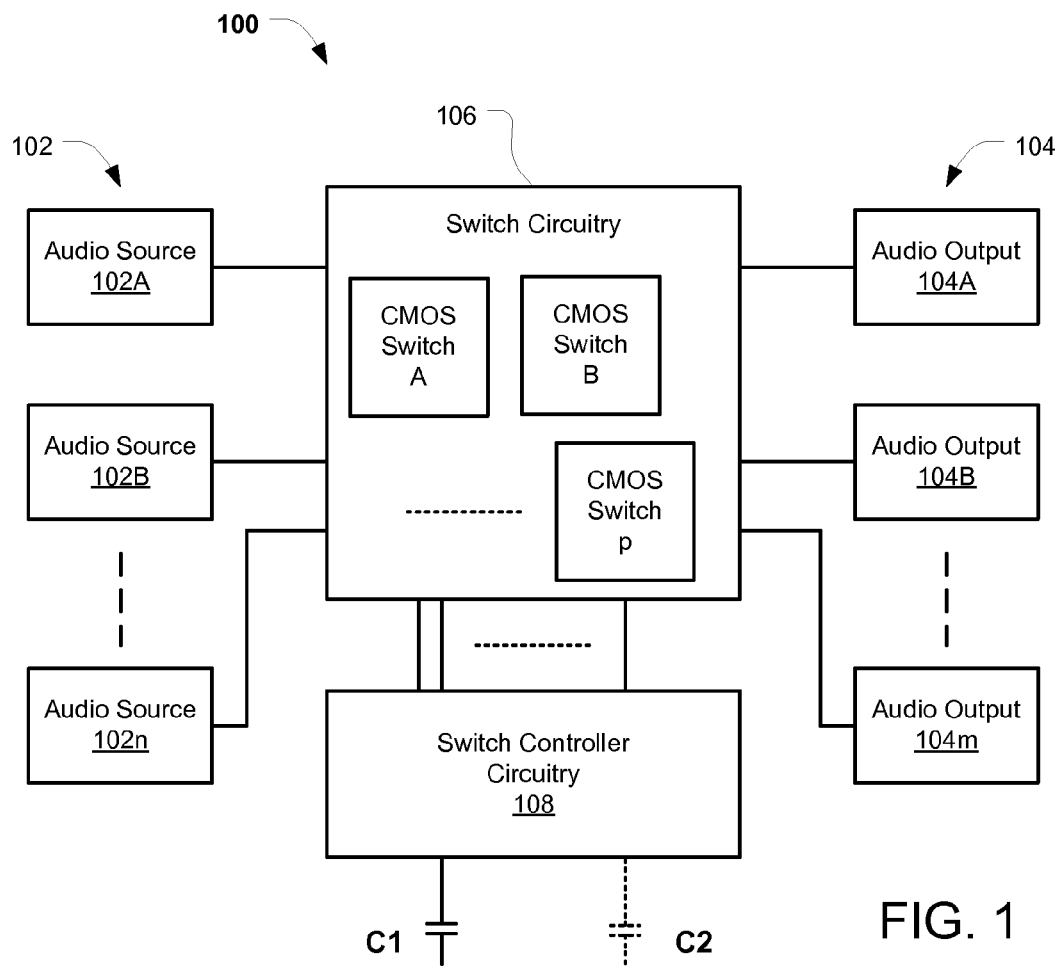
FIG. 1 illustrates a switch control system consistent with various embodiments of the present disclosure.

FIG. 1 illustrates a switch control system 100 consistent with various embodiments of the present disclosure. The switch control system 100 of FIG. 1 generally includes a plurality of audio sources audio source 102A, audio source 102B, . . . , audio source 102n, a plurality of audio outputs audio output 104A, audio output 104B, . . . , audio output 102m), switch circuitry 106 and switch controller circuitry 108. Each audio source, collectively designated as 102, may include for example, an external physical audio device (e.g., amplifier circuit, preamplifier circuit, CD/MP3 player (e.g. IPOD®, mobile audio player, etc.), DVD player, cable/satellite box, television/video device, microphone, etc.), a logical audio device such as may be derived from a logical route of audio sources, and/or a physical or logical audio stage within a larger audio system or subsystem. Each audio output, collectively designated as 104, may include for example, an external physical audio output device (e.g., speaker, headphones, earplugs, amplifier circuit, preamplifier circuit, audio switch terminal, etc.), a logical audio device such as may be derived from a logical route of audio sources, and/or a physical or logical audio stage within a larger audio system or subsystem. Switch circuitry 106 generally includes CMOS switch circuitry, for example, individual CMOS switches designated as CMOS Switch A, CMOS Switch B, . . . , CMOS Switch p. In exemplary embodiments, each CMOS switch circuitry includes an NMOS switch side and a PMOS switch side (in a known arrangement) configured to turn on and turn off together to couple/decouple a source 102 to/from an output 104. The following description of a CMOS switches refers to an individual NMOS and PMOS elements, and are used herein in a manner consistent with the ordinary meaning of CMOS switch devices. It should be understood that although the following description makes specific reference to CMOS switch circuitry, in some embodiments such switch circuitry may be realized using BJT elements and/or other known or after-developed switching circuits.

The switch circuitry 106 may be configured as a multiple throw, multiple pole switch to enable switching between the plurality of audio sources 102 and the plurality of audio outputs 104. To form multiple pole and/or multiple throw switches, a plurality of CMOS switches, each arranged as a single pole, single throw switch, may be combined. Thus, p discreet CMOS switch circuits may be used to switch n audio sources independently to m audio outputs, using any number of poles and/or throws between sources 102 and outputs 104 (where n, m and p may or may not be equal).

Switch controller circuitry 108 is generally configured to control one or more CMOS switches of the switch circuitry 106 to couple or decouple one or more audio sources 102 to/from one or more audio outputs 104. Thus, switch controller circuitry 108 may include routing logic and/or multiplexor (MUX) circuitry (not shown in this figure) to route one or more audio sources 102 to one or more audio outputs 104, via one or more CMOS switch elements. As may be known, when a CMOS switch is turned ON (conducting) or OFF (non-conducting) using a conventional rectangular wave control signal, an audible pop or click may be heard at the output. Accordingly, to reduce or eliminate the pop/click associated with the turn on/off of a CMOS switch, the switch controller circuitry 108 is configured to provide a slow ramp up and/or ramp down of switch control signals for the CMOS switch using at least one capacitor. In some embodiments, a single capacitor C1 may be used to generate slow ramp up/ramp down switch control signals to control the conduction state of at least one CMOS switch. In other embodiments, two capacitors, C1 and C2, may be used to generate slow ramp up and ramp down switch control signals to control one or more CMOS switches. The term "slow" as used herein means that the ramp up and/or ramp down time of the switch control signal is controlled so that the ramp up or ramp down period is longer than a conventional square wave that may be used to control the conduction state of a CMOS switch. These and other embodiments will be described in greater detail below. The switch system 100 depicted in FIG. 1 may be included with, or form part of, a general-purpose and/or custom integrated circuit (IC) such as a semiconductor integrated circuit chip, system on chip (SoC), etc.

Figure 2A:
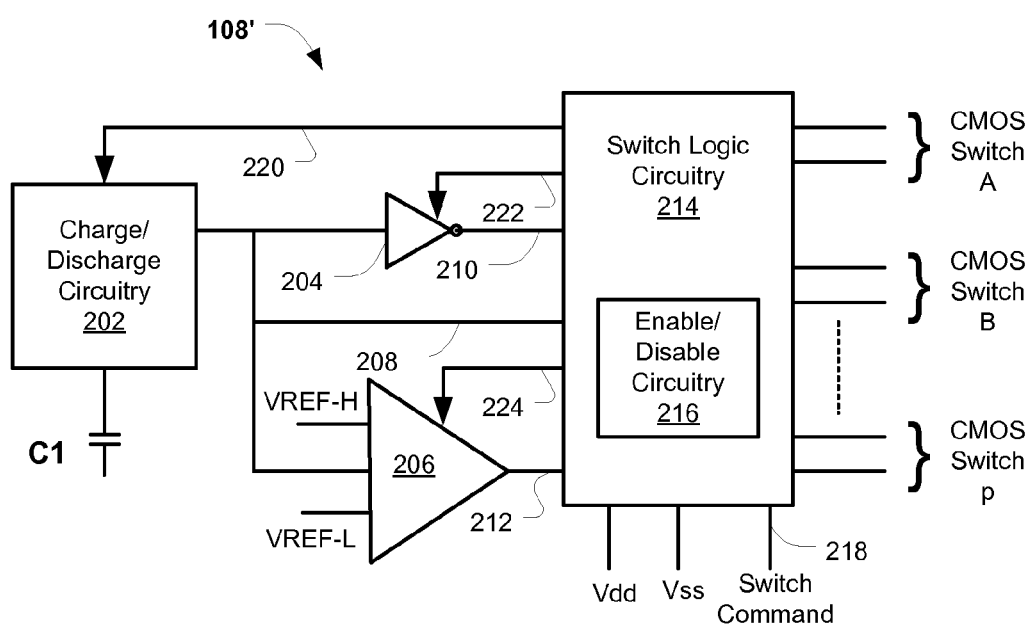
FIG. 2A illustrates switch controller circuitry consistent with one embodiment of the present disclosure.
Figure 2B:
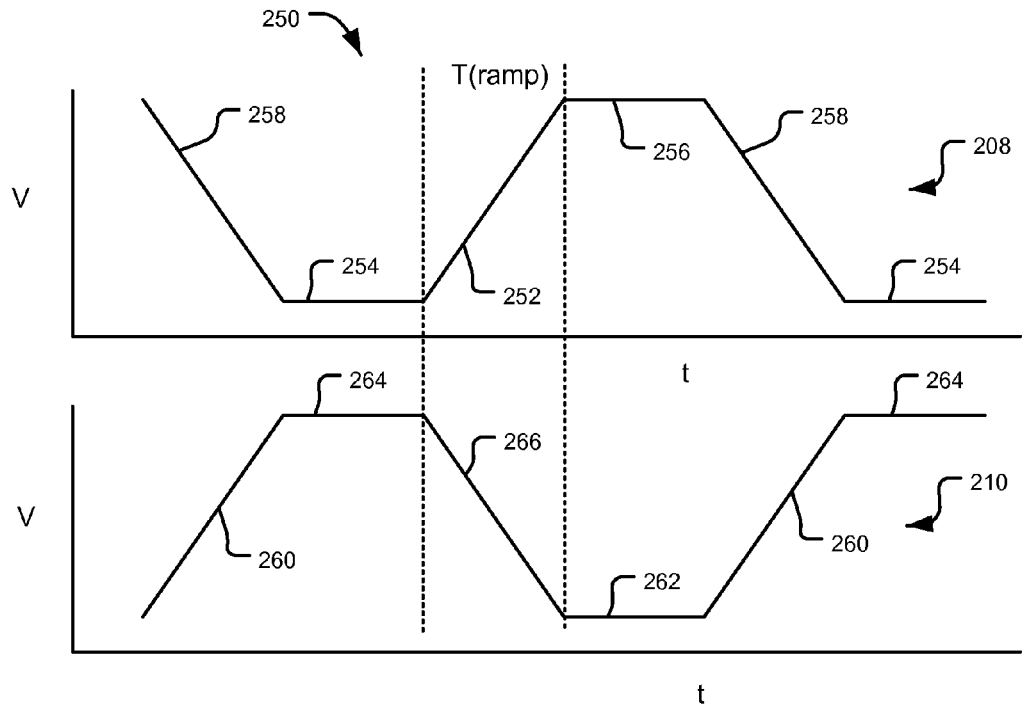
FIG. 2B illustrates a signal plot of complimentary switch control signals consistent with one embodiment of the present disclosure.

FIG. 2A illustrates switch controller circuitry 108' consistent with one embodiment of the present disclosure. The switch controller circuitry 108' of this embodiment includes a capacitor C1, charge/discharge circuitry 202, analog inverter circuitry 204 and comparator circuitry 206. The charge/discharge circuitry 202 is generally configured to charge and/or or discharge the capacitor C1 to generate a slow ramp up signal 208 during charging of C1 and a slow ramp down signal 208 during discharging of C1. The charge/discharge circuitry 202 may include, for example, one or more current sources configured to charge and/or discharge C1, RC time constant circuitry, and/or other known or after-developed circuitry configured to charge or discharge a capacitor. In general, the signal 208 is used as a switch control signal for one or more CMOS switches. Since a CMOS switch generally includes an NMOS/PMOS switch pair that are controlled together, the analog inverter circuitry 204 may be configured to generate a complimentary ramp up/ramp down switch control signal 210 based on signal 208. Thus, signals 208 and 210 may be used to control the NMOS and PMOS sides of a CMOS switch to control the conduction state of the CMOS switch, and thus, the overall amplitude of signal 208 and 210 may have a value sufficient to turn an NMOS switch ON or a PMOS switch OFF. Referring briefly to FIG. 2B, illustrated a signal plot 250 of complimentary switch control signals consistent with one embodiment of the present disclosure. Signal 208 is illustrated through several ramp up 252, steady state low 254, steady state high 256 and ramp down 258 periods. Similarly, complimentary signal 210 is illustrated through several ramp up 260, steady state low 262, steady state high 264 and ramp down 266 periods. As signal 208 ramps down 258 (by discharging capacitor C1), signal 210 ramps up 260 in a complimentary fashion, and vice versa when C1 is charging. Likewise, the steady state high and low voltage states of signals 208 and 210 are complimentary; when signal 208 reaches steady a state low 254 (by fully discharging capacitor C1), signal 210 has a steady state high 264 value (and vice versa when C1 is fully charged). The ramp up or ramp down time (T(ramp)) may be based on, for example, the value of C1 and/or the value of the current source and/or RC circuit of the charge discharge circuitry 202. The signals 208 and 210 are used to control the conduction states of respective NMOS/PMOS switches of a CMOS switch, and the conduction state of a CMOS switch may be changed when signals 208 and 210 changes from high to low or low to high. The switch control signals, therefore, may be used as gate control signals for the NMOS/PMOS switches of the CMOS switch.

The comparator circuitry 206 is generally configured to compare signal 208 to predetermined thresholds, and is generally configured to determine when the capacitor C1 is fully charged or fully discharged. If signal 208 is ramping up, comparator circuitry 206 may compare signal 208 with a high reference signal (VREF-H), and when signal 208 exceeds VREF-H, the output signal 212 of the comparator circuitry 206 may be a High value (e.g., a logic or digital "1"). The value of VREF-H may be selected to be close to a high reference rail (e.g., Vdd), e.g., within 100 mV. of Vdd. In general, the value of VREF-H may be based on the turn on threshold voltage (Vth) of an NMOS switch of the CMOS switch circuitry, or the turn off threshold voltage (Vth) of a PMOS switch of the CMOS switch circuitry, such that when signal 208 exceeds VREF-H the respective switch (NMOS or PMOS) is fully ON or fully OFF. Similarly, if signal 208 is ramping down, comparator circuitry 206 may compare signal 208 with a low reference signal (VREF-L), and when signal 208 drops below VREF-L, the output signal 212 of the comparator circuitry 206 may be a Low value (e.g., a logic or digital "0"). The value of VREF-L may be selected to be close to a ground or reference potential rail (e.g., GND, Vss, etc.), e.g., within 100 mV. of a GND voltage rail. In general, the value of VREF-L may be based on the turn on threshold voltage (Vth) of a PMOS switch of the switch circuitry 106 or the turn off threshold voltage (Vth) of an NMOS switch of the switch circuitry 106, such that when signal 208 is below VREF-L the respective switch (PMOS or NMOS) is fully ON or fully OFF. Thus, the comparator 206 essentially operates to determine when the ramp up or ramp down time period of the switch control signal 208 exceeds a predetermined time period, as determined by the value of VREF-H and/or VREF-L. Of course, the comparator circuitry 206 could be configured to compare the complimentary switch control signal 210 to VREF-H and VREF-L, instead of the switch control signal 208.

The switch controller circuitry 108' of this embodiment also includes switch logic circuitry 214 configured to turn on and/or turn off one or more CMOS switches to couple/decouple at least one audio source 102 to/from at least one audio output 104, based on a switch command signal 218. The switch command signal 218 may include, for example, a user supplied, preprogrammed and/or programmable command signal that is configured to cause the switch logic circuitry 214 to turn on and/or turn off at least one CMOS switch. When the switch logic circuitry 214 receives a switch command, via the switch command signal 218, to turn a CMOS switch ON or OFF, switch logic circuitry 214 is configured to route signals 208 and 210 to respective NMOS/PMOS sides of at least one CMOS switch to enable a slow turn on or a slow turn off of the at least one CMOS switch.

The switch logic circuitry 214 may be configured to route an appropriate gate control signal 208/210 to a respective NMOS/PMOS sides of a CMOS switch, based on the state of the capacitor C1. In some embodiments, for example, if C1 is initially discharged, upon a switch command signal 218 to turn ON a first CMOS switch, C1 will begin to charge and signal 208 will ramp up and signal 210 will ramp down. Switch logic circuitry 214 is configured to route signal 208 to the gate of the first NMOS switch and route signal 210 to the gate of the first PMOS switch (thus slowly turning the first CMOS switch ON). Once the capacitor C1 is fully charged, it may remain in the fully charged state until another switch command signal is received. If another switch command is received to turn ON a second CMOS switch and turn OFF the first CMOS switch, C1 may begin to discharge and signal 208 will ramp down and signal 210 will ramp up. In this case, switch logic circuitry 214 is configured to route signal 208 to the gate of the second PMOS switch and route signal 210 to the gate of the second NMOS switch (thus slowly turning the second CMOS switch ON), and route signal 208 to the gate of the first NMOS switch and route signal 210 to the gate of the PMOS switch (thus slowly turning the first CMOS switch OFF). Once the capacitor C1 is fully discharged, it may remain in the fully discharged state until another switch command signal is received. In other embodiments, C1 may only be used in a charging mode, and thus, signal 208 represents the ramp up gate control signal and signal 210 represents the ramp down gate control signal. In still other embodiments, switches may be turned on and/or off in subsequent charge/discharge cycles. Thus for example, one switch may be turned off during a discharge cycle and another switch may be turned on during a subsequent charge cycle. To significantly reduce power consumption, the switch controller circuitry 108' may also include enable/disable circuitry 216 that is configured to enable or disable selected components of the circuitry 108' based on the charging or discharging state of the capacitor C1. In addition, the enable/disable circuitry is configured to couple the gate control signals of one or more CMOS switches to selected rail voltages after a predetermined time period for a slow turn on or slow turn off of the CMOS switch. When the switch logic circuitry 214 receives a switch command signal 218 to switch one or more CMOS switches on or off, the enable/disable circuitry 216 is configured to generate enable/disable signals 220, 222 and 224 to enable the charge/discharge circuitry 202, the analog inverter circuitry 204 and the comparator circuitry 206, respectively. As described above, the output 212 of the comparator 206 switches states as the ramp up or ramp down signal exceeds or drops below the reference voltages (VREF-H and VREF-L). Thus, assuming that C1 is initially fully discharged, when the switch logic circuitry 214 receives a switch command signal 218 to switch one or more CMOS switches on or off, the enable/disable signal 220 controls the charge/discharge circuitry 202 to begin charging the C1 capacitor to generate the ramp up signal 208 and the complimentary ramp down signal 210. As the signal 208 exceeds VREF-H, the comparator output signal 212 changes state (e.g., from a low to a high value). Once the comparator output signal 212 changes state, indicating that the capacitor C1 is almost fully charged and that the CMOS switch receiving signal 208 (and signal 210) has switched states, the enable/disable circuitry 216 is configured to couple the signal 208 to a positive voltage potential rail (e.g., by coupling the capacitor C1 to Vdd to ensure C1 remains in a charged state) and couple signal 210 to a low voltage potential rail (e.g., by coupling the output of comparator 206 to Vss, GND, etc.). Once the signals 208 and 210 are tied to an appropriate voltage rail, the enable/disable circuitry 216 is configured to generate enable/disable signals 220, 222 and 224 to disable the charge/discharge circuitry 202, the analog inverter circuitry 204 and the comparator circuitry 206, respectively. In some embodiment, when the comparator circuitry 206 is disabled, latch circuitry (not shown) may be used to keep the output of the comparator at its last state. In this manner, the switch state of at least one CMOS switch remains fixed and the current draw of the switch controller circuitry 108' is substantially reduced.

Figure 3:
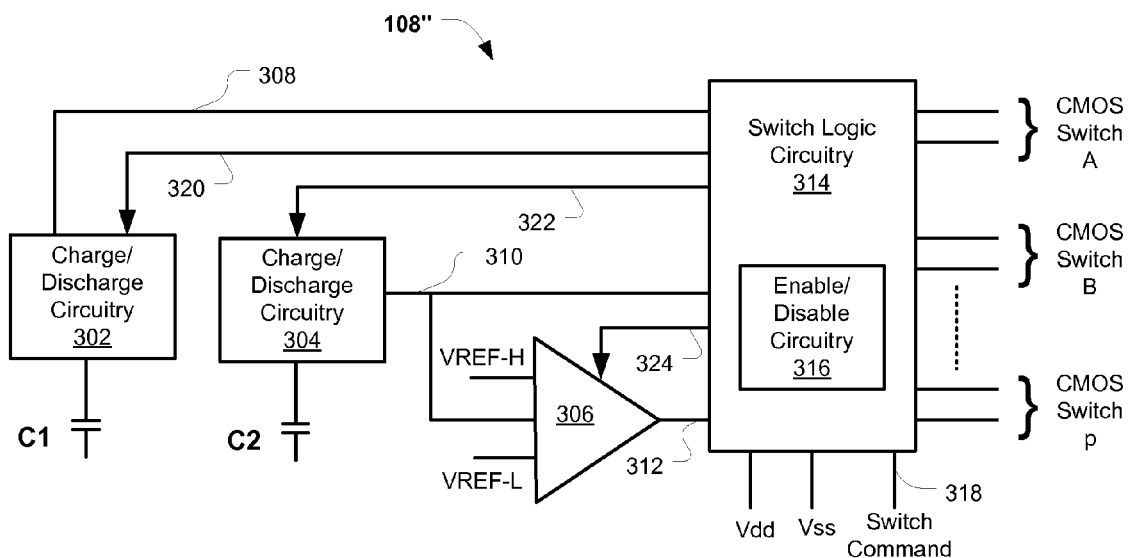
FIG. 3 illustrates switch controller circuitry consistent with another embodiment of the present disclosure.

FIG. 3 illustrates switch controller circuitry 108'' consistent with another embodiment of the present disclosure. This embodiment is similar to the embodiment of FIG. 2A, except this embodiment includes second charge/discharge circuitry 304 and a second capacitor C2, instead of analog inverter circuitry 204, to generate a switch control signal 310 that is complimentary to the switch control signal 308. In this embodiment, when the switch logic circuitry 314 receives a switch command signal 318 to switch the conduction state of one or more CMOS switches, the switch logic circuitry 314 enables (via enable/disable signal 320) the first charge/discharge circuitry 302 to charge or discharge C1 to generate ramp up or ramp down signal 208, and the switch logic circuitry 314 enables (via enable/disable signal 322) the second charge/discharge circuitry 304 to discharge or charge C2 to generate a complimentary ramp down or ramp up signal 310. Signals 308 and 310 are routed to at least one CMOS switch to provide a slow turn on or slow turn off of the at least one CMOS switch. As in the previous embodiment, once signal 310 exceeds or drops below the thresholds VREH-H or VREF-L, the enable/disable circuitry 316 ties signals 308 and 310 to an appropriate voltage rail and disables circuitry 302, 304 and 306 to conserve power.

If the values of C1 and C2 are substantially equal (e.g., within a selected tolerance range), the comparator circuitry 306 may compare either signal 310 (as shown) or signal 308 (not shown) to the reference voltages to generate the output signal 312. In other embodiments, if C1 and C2 are not equal (such that their ramp up/ramp down times are substantially different), additional comparator circuitry (not shown) may be used to compare signal 308 to the reference voltages to generate an additional comparison output signal. In such an embodiment, the enable/disable circuitry 316 may be configured to independently enable and disable the respective charge/discharge circuitry 302 and 304, based on the overall operational characteristics of C1 and C2 and to facilitate a slow ramp up and ramp down of the switch control signals 308 and 310. Otherwise, the charge/discharge circuitry 302 operates in a similar manner as the charge/discharge circuitry 202, the comparator circuitry 306 operates in a similar manner as the comparator circuitry 206 and the switch logic circuitry 314 operates in a similar manner as switch logic circuitry 214, the description of which is provided above and omitted in this embodiment for clarity.

Figure 4:
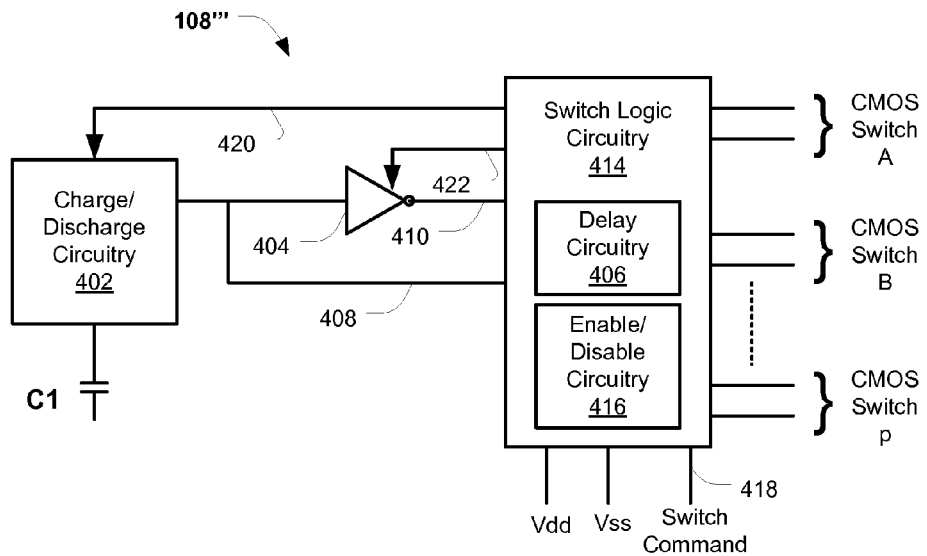
FIG. 4 illustrates switch controller circuitry consistent with another embodiment of the present disclosure.

FIG. 4 illustrates switch controller circuitry 108''' consistent with another embodiment of the present disclosure. This embodiment includes delay circuitry 406 configured to control the enable/disable circuitry 416 to delay the coupling of the switch control signals 408/410 to an appropriate rail voltage for a selected time period. Thus, instead of comparator circuitry 206/306 of the previous embodiments to generate an indication of the charging or discharging state of the capacitor (C1 or C2), the delay circuitry 406 is configured to detect the start of a ramp up or ramp down on signal 408 and/or 410 and wait a predefined delay period. Once the predefined delay period has expired (meaning once the ramp up or ramp down signal exceeds the predetermined time period defined by the delay time), the delay circuitry 406 is configured to control enable/disable circuitry 416 to couple the switch control signals 408/410 to an appropriate voltage rail, as described above. The predefined delay period (of the delay circuitry 406) may be selected to enable a sufficiently slow turn on or turn off of a CMOS switch to reduce or eliminate an audible pop/click. Otherwise, the charge/discharge circuitry 402 operates in a similar manner as the charge/discharge circuitry 202, the analog inverter circuitry 404 operates in a similar manner as analog inverter circuitry 204, the switch logic circuitry 414 operates in a similar manner as switch logic circuitry 214, and the enable/disable circuitry 416 operates in a similar manner as the enable/disable circuitry 216, the description of which is provided above and omitted in this embodiment for clarity. In other embodiments, instead of analog inverter circuitry 404 to generate the complimentary switch control signal 410, second charge/discharge circuitry and a second capacitor (not shown in this figure) may be used, similar to the embodiment of FIG. 3.

Figure 5:
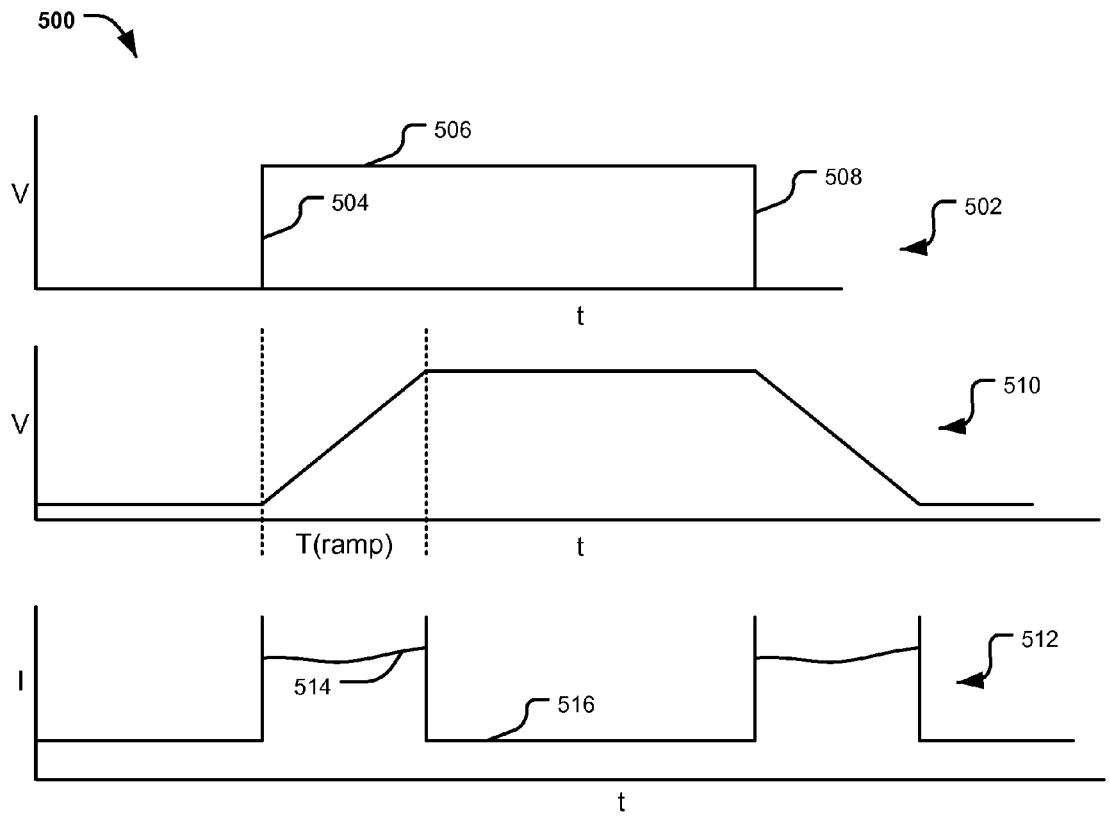
FIG. 5 illustrates a signal plot of selected signals consistent with various embodiments of the present disclosure.

Power saving advantages of the foregoing embodiments are depicted in of FIG. 5 which illustrates a signal plot 500 of selected signals consistent with various embodiments of the present disclosure. With continued reference to FIGS. 1-4, signal 502 is a switch command signal. The switch command signal has a rising edge 504, a steady state period 506 and a falling edge 508, where the rising edge represents a switch command to turn on or off at least one CMOS switch, and the falling edge represents another switch command to turn on or off at least one CMOS switch. In response to the switch command signal 502, a switch control signal 510 is generated across a capacitor (C1 and/or C2). In particular, on the rising edge 504 of the switch command signal 502, the switch control signal begins to ramp up for a selected ramp up period (T(ramp)). On the falling edge 508 of the switch command signal 502, the switch control signal begins to ramp down for a selected ramp down period (T(ramp)). Focusing on the first switch command (at rising edge 504), at some point during the ramp up period of the switch control signal 510, the switch is fully turned on (if NMOS switch) or off (if PMOS switch). Once the ramp up period is complete, the switch control signal is coupled to a voltage rail (in this case a positive voltage rail). Signal plot 512 depicts Icc current drawn by the collection of the comparator, inverter and charge/discharge circuitry of the switch controller circuitry 108. During the ramp up period, the comparator, inverter and charge/discharge circuitry draws a predefined amount of current shown generally at 514. Once the switch control signals are tied to an appropriate voltage rail and the comparator, inverter and charge/discharge circuitry are disables, the Icc current drops to substantially zero, as shown generally at 516. Thus, significant power savings is achieved.

Figure 6:
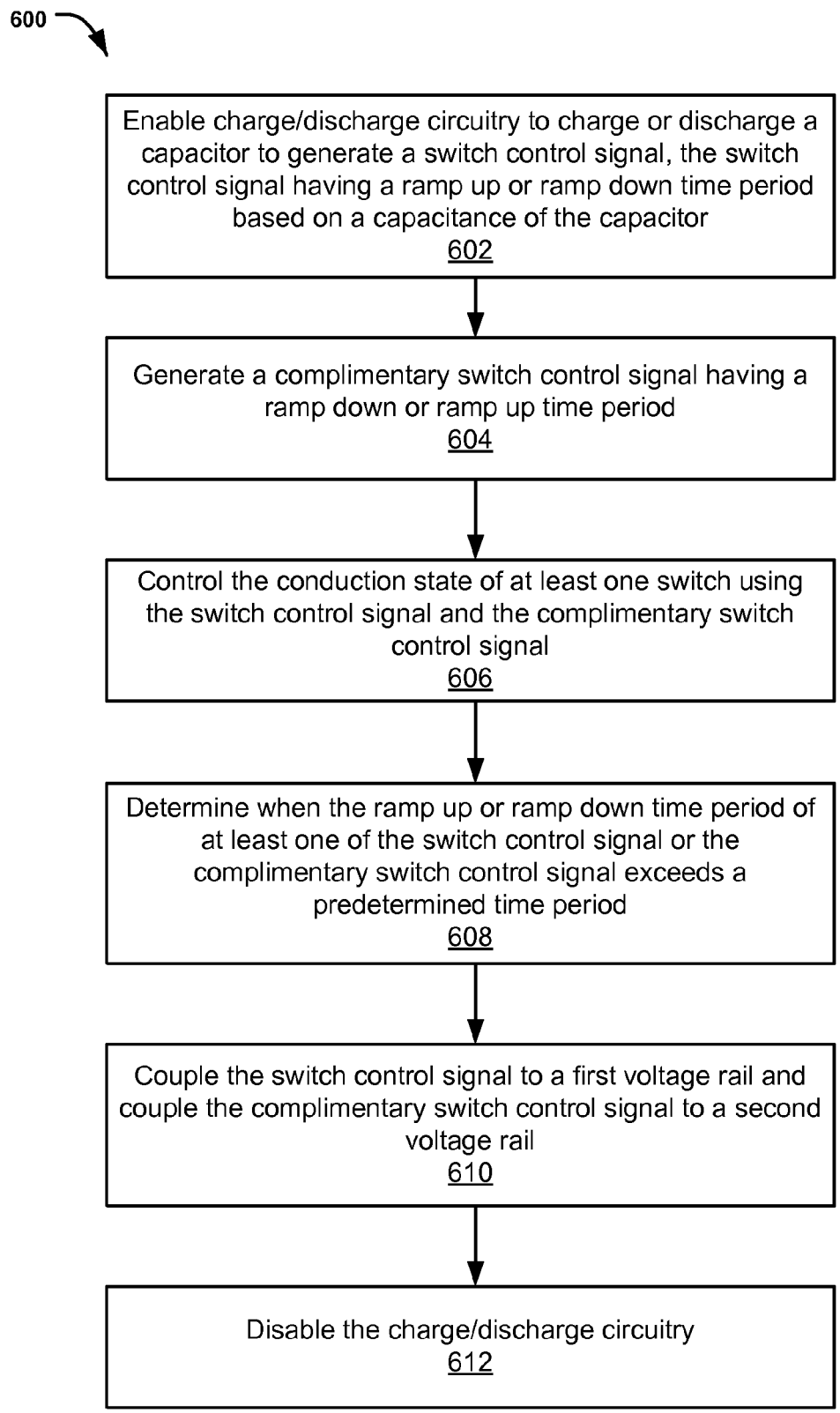
FIG. 6 illustrates a flowchart of operations according to one embodiment of the present disclosure.

FIG. 6 illustrates a flowchart 600 of operations according to one embodiment. Operations of this embodiment may include enabling charge/discharge circuitry to charge or discharge a capacitor to generate a switch control signal, where the switch control signal has a ramp up or ramp down time period based on a capacitance of the capacitor 602. Operations may also include generating a complimentary switch control signal having a ramp down or ramp up time period 604. Operations may also include controlling the conduction state of at least one switch using the switch control signal and the complimentary switch control signal 606. Operations according to this embodiment may also include determining when the ramp up or ramp down time period of at least one of the switch control signal or the complimentary switch control signal exceeds a predetermined time period 608. Operations may also include coupling the switch control signal to a first voltage rail and coupling the complimentary switch control signal to a second voltage rail 610. In addition, to conserve power, operations according to this embodiment may also include disabling the charge/discharge circuitry 612.

While FIG. 6 illustrates various operations according to one embodiment, it is to be understood that in not all of these operations are necessary. Indeed, it is fully contemplated herein that in other embodiments of the present disclosure the operations depicted in FIG. 6 may be combined in a manner not specifically shown in any of the drawings, but still fully consistent with the present disclosure. Thus, claims directed to features and/or operations that are not exactly shown in one drawing are deemed within the scope and content of the present disclosure. In addition, the term "circuitry" or "circuit", as used in any embodiment herein, may comprise, for example, singly or in any combination, hardwired circuitry, programmable circuitry, state machine circuitry, and/or circuitry available in a larger system, for example, discrete elements that may be included as part of an integrated circuit.

Thus, in one embodiment the present disclosure provides a switch controller for controlling at least one switch. The switch controller includes a capacitor and charge/discharge circuitry configured to generate a switch control signal by charging or discharging the capacitor. The switch control signal has a ramp up or ramp down time period based on a capacitance of the capacitor. The switch controller also includes analog inverter circuitry configured to generate a complimentary switch control signal based on the switch control signal. The complimentary control signal has a ramp up or ramp down time period based on the switch control signal. The switch controller also includes switch logic circuitry configured to route the switch control signal and the complimentary switch control signal to control the conduction state of the at least one switch, and enable/disable circuitry configured to enable and disable the charge/discharge circuitry and the analog inverter circuitry based on the charging or discharging state of the capacitor. The enable/disable circuitry is further configured to, based on a determination of when the ramp up or ramp down time period of at least one of the switch control signal or the complimentary switch control signal exceeds a predetermined time period, couple the switch control signal to a first voltage rail and couple the complimentary switch control signal to a second voltage rail.

In another embodiment, the present disclosure provides a switch controller for controlling at least one switch. The switch controller of this embodiment includes a first capacitor, first charge/discharge circuitry configured to generate a switch control signal by charging or discharging the first capacitor, the switch control signal having a ramp up or ramp down time period based on a capacitance of the first capacitor, a second capacitor and second charge/discharge circuitry configured to generate a complimentary switch control signal by charging or discharging the second capacitor, the complimentary switch control signal having a ramp up or ramp down time period based on a capacitance of the second capacitor. The switch controller of this embodiment also includes switch logic circuitry configured to route the switch control signal and the complimentary switch control signal to control the conduction state of the at least one switch, and enable/disable circuitry configured to enable and disable the first charge/discharge circuitry and the second charge/discharge circuitry based on the charging or discharging state of the first capacitor or the second capacitor. The enable/disable circuitry is further configured to, based on a determination of when the ramp up or ramp down time period of at least one of the switch control signal or the complimentary switch control signal exceeds a predetermined time period, couple the switch control signal to a first voltage rail and couple the complimentary switch control signal to a second voltage rail.

In yet another embodiment, the present disclosure provides a method of controlling at least one switch. The method includes enabling a first charge/discharge circuitry to charge or discharge a first capacitor to generate a switch control signal, the switch control signal having a ramp up or ramp down time period based on a capacitance of the first capacitor; generating a complimentary switch control signal having a ramp up or ramp down time period; controlling the conduction state of the at least one switch using the switch control signal and the complimentary switch control signal; determining when the ramp up or ramp down time period of at least one of the switch control signal or the complimentary switch control signal exceeds a predetermined time period; coupling the switch control signal to a first voltage rail and coupling the complimentary switch control signal to a second voltage rail; and disabling the first charge/discharge circuitry.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A switch controller for controlling at least one switch, comprising:
    a capacitor;
    charge/discharge circuitry configured to generate a switch control signal by charging or discharging the capacitor, the switch control signal having a ramp up or ramp down time period based on a capacitance of the capacitor;
    analog inverter circuitry configured to generate a complimentary switch control signal based on the switch control signal, the complimentary control signal having a ramp up or ramp down time period based on the switch control signal;
    switch logic circuitry configured to route the switch control signal and the complimentary switch control signal to control the conduction state of the at least one switch; and
    enable/disable circuitry configured to conserve power by enabling and disabling the charge/discharge circuitry and the analog inverter circuitry based on the charging or discharging state of the capacitor; the enable/disable circuitry is further configured to, based on a determination of when the ramp up or ramp down time period of at least one of the switch control signal or the complimentary switch control signal exceeds a predetermined time period, couple the switch control signal to a first voltage rail and couple the complimentary switch control signal to a second voltage rail.

2. The switch controller of claim 1, further comprising:
    comparator circuitry configured to compare at least one of the switch control signal or the complimentary switch control signal to a first threshold signal and a second threshold signal to generate a compare output signal indicative of the determination when the ramp up or ramp down time period of at least one of the switch control signal or the complimentary switch control signal exceeds the predetermined time period.

3. The switch controller of claim 1, further comprising:
    delay circuitry configured to detect the start of a ramp up or ramp down of at least one of the switch control signal or the complimentary switch control signal, wait for the predetermined time period, and to generate a control signal indicative of the determination when the ramp up or ramp down time period of at least one of the switch control signal or the complimentary switch control signal exceeds the predetermined time period.

4. The switch controller of claim 1, wherein
    the capacitance value of the capacitor is selected to suppress an audible switching noise associated with switching the at least one switch.

5. The switch controller of claim 1, wherein
    the predetermined time period corresponds to a time to fully charge or fully discharge the capacitor.

6. The switch controller of claim 1, wherein
    the switch logic circuitry is further configured to control the at least one switch to couple or decouple at least one audio source to or from at least one audio output.

7. A switch controller for controlling at least one switch, comprising:
    a first capacitor;
    first charge/discharge circuitry configured to generate a switch control signal by charging or discharging the first capacitor, the switch control signal having a ramp up or ramp down time period based on a capacitance of the first capacitor;
    a second capacitor;
    second charge/discharge circuitry configured to generate a complimentary switch control signal by charging or discharging the second capacitor, the complimentary switch control signal having a ramp up or ramp down time period based on a capacitance of the second capacitor;
    switch logic circuitry configured to route the switch control signal and the complimentary switch control signal to control the conduction state of the at least one switch; and
    enable/disable circuitry configured to conserve power by enabling and disabling the first charge/discharge circuitry and the second charge/discharge circuitry based on the charging or discharging state of the first capacitor or the second capacitor; the enable/disable circuitry is further configured to, based on a determination of when the ramp up or ramp down time period of at least one of the switch control signal or the complimentary switch control signal exceeds a predetermined time period, couple the switch control signal to a first voltage rail and couple the complimentary switch control signal to a second voltage rail.

8. The switch controller of claim 7, further comprising:
    comparator circuitry configured to compare at least one of the switch control signal or the complimentary switch control signal to a first threshold signal and a second threshold signal to generate a compare output signal indicative of the determination when the ramp up or ramp down time period of at least one of the switch control signal or the complimentary switch control signal exceeds the predetermined time period.

9. The switch controller of claim 7, further comprising:
    delay circuitry configured to detect the start of a ramp up or ramp down of at least one of the switch control signal or the complimentary switch control signal, wait for the predetermined time period, and to generate a control signal indicative of the determination when the ramp up or ramp down time period of at least one of the switch control signal or the complimentary switch control signal exceeds the predetermined time period.

10. The switch controller of claim 7, wherein
    the capacitance values of the first and second capacitors are selected to suppress an audible switching noise associated with switching the at least one switch.

11. The switch controller of claim 7, wherein
    the predetermined time period is selected to be a substantial near a time to fully charge or fully discharge the first capacitor or the second capacitor.

12. The switch controller of claim 7, wherein
the switch logic circuitry is further configured to control the at least one switch to couple or decouple at least one audio source to or from at least one audio output.

13. The switch controller of claim 7, wherein
the capacitance values of the first and second capacitors are substantially equal.

14. A method of controlling at least one switch, comprising:
enabling a first charge/discharge circuitry to charge or discharge a first capacitor to generate a switch control signal, the switch control signal having a ramp up or ramp down time period based on a capacitance of the first capacitor;
generating a complimentary switch control signal having a ramp up or ramp down time period;
controlling the conduction state of the at least one switch using the switch control signal and the complimentary switch control signal;
determining when the ramp up or ramp down time period of at least one of the switch control signal or the complimentary switch control signal exceeds a predetermined time period;
coupling the switch control signal to a first voltage rail and coupling the complimentary switch control signal to a second voltage rail; and
conserving power by disabling the first charge/discharge circuitry.

15. The method of claim 14, further comprising:
enabling a second charge/discharge circuitry to charge or discharge a second capacitor to generate the complimentary switch control signal, the complimentary switch control signal having a ramp up or ramp down time period based on a capacitance of the second capacitor;
disabling the second charge/discharge circuitry after the predetermined time period.

16. The method of claim 14, further comprising:
enabling analog inverter circuitry to generate the complimentary switch control signal having a ramp up or ramp down time period based on switch control signal;
disabling the analog inverter circuitry after the predetermined time period.

17. The method of claim 14, further comprising:
comparing at least one of the switch control signal or the complimentary switch control signal to a first threshold signal and a second threshold signal to generate a compare output signal indicative of the determining when the ramp up or ramp down time period of at least one of the switch control signal or the complimentary switch control signal exceeds the predetermined time period.

18. The method of claim 14, wherein
the capacitance value of the first capacitor is selected to suppress an audible switching noise associated with switching the at least one switch.

19. The method of claim 14, wherein
the predetermined time period corresponds to a time to fully charge or fully discharge the first capacitor.

20. The method of claim 14, further comprising:
controlling the at least one switch to couple or decouple at least one audio source to or from at least one audio output.

* * * * *